United States Patent
Yitzchaik et al.

(10) Patent No.: US 6,316,098 B1
(45) Date of Patent: Nov. 13, 2001

(54) MOLECULAR LAYER EPITAXY METHOD AND COMPOSITIONS

(75) Inventors: Shlomo Yitzchaik; Vladimir Burtman, both of Jerusalem (IL)

(73) Assignee: Yissum Research Development Company of the Hebrew University of Jerusalem, Jerusalem (IL)

( * ) Notice: Subject to any disclaimer, the term of this patent is extended or adjusted under 35 U.S.C. 154(b) by 0 days.

(21) Appl. No.: 09/273,659

(22) Filed: Mar. 23, 1999

Related U.S. Application Data

(60) Provisional application No. 60/079,699, filed on Mar. 27, 1998.

(51) Int. Cl.[7] .................................................... B32B 5/04
(52) U.S. Cl. .................... 428/339; 428/338; 428/332; 437/64; 437/26; 437/77; 117/84; 117/99
(58) Field of Search ............................ 428/332, 333, 428/339, 334; 117/84, 99; 437/64, 26, 77, 76

(56) References Cited

U.S. PATENT DOCUMENTS

| | | |
|---|---|---|
| 4,342,945 | 8/1982 | Ketchpel . |
| 4,391,888 | 7/1983 | Chang et al. . |
| 4,690,750 | 9/1987 | Roxlo et al. . |
| 4,703,096 | 10/1987 | Choe . |
| 4,746,181 | 5/1988 | Hayakawa et al. . |
| 4,859,625 | 8/1989 | Matsumoto . |
| 5,076,860 | 12/1991 | Ohba et al. . |
| 5,079,594 | 1/1992 | Mitsuyu et al. . |
| 5,155,566 | 10/1992 | Nakayama et al. . |
| 5,166,100 | 11/1992 | Gossard et al. . |
| 5,240,762 | 8/1993 | Miura et al. . |
| 5,254,207 | 10/1993 | Nishizawa et al. . |
| 5,274,246 | 12/1993 | Hopkins et al. . |
| 5,284,779 | 2/1994 | Miyanaga . |
| 5,296,403 | 3/1994 | Nishizawa et al. . |
| 5,349,209 | 9/1994 | Moyer et al. . |
| 5,374,570 | 12/1994 | Nasu et al. . |
| 5,383,212 | 1/1995 | Knox et al. . |
| 5,401,615 | 3/1995 | Pai et al. . |
| 5,424,560 | 6/1995 | Norman et al. . |
| 5,434,102 | 7/1995 | Watanabe et al. . |
| 5,532,511 | 7/1996 | Nishizawa et al. . |
| 5,532,550 | 7/1996 | Adler . |
| 5,541,478 | 7/1996 | Troxell et al. . |
| 5,587,329 | 12/1996 | Hseuh et al. . |
| 5,612,549 | 3/1997 | Nelson et al. . |
| 5,614,435 | 3/1997 | Petroff et al. . |
| 5,623,476 | 4/1997 | Eguchi et al. . |
| 5,641,611 | 6/1997 | Shieh et al. . |
| 5,656,508 | 8/1997 | So et al. . |
| 5,677,545 | 10/1997 | Shi et al. . |
| 5,681,756 | 10/1997 | Norman et al. . |
| 5,692,075 | 11/1997 | Hwang et al. . |
| 5,693,130 | 12/1997 | Nishizawa et al. . |
| 5,693,962 | 12/1997 | Shi et al. . |
| 5,707,745 | 1/1998 | Forrest et al. . |

*Primary Examiner*—Duc Truong
(74) *Attorney, Agent, or Firm*—Browdy and Neimark

(57) ABSTRACT

Organic superlattices formed by chemical vapor deposition/molecular layer epitaxy (CVD/MLE), and a novel CVD/MLE method of forming organic molecular monolayers are disclosed. The method utilized covalent linkage, combined with layer sublimation, to form p-stacked, ordered, oriented monomolecular layers for use in a variety of electronic applications.

7 Claims, 12 Drawing Sheets n = 1, 2, 3

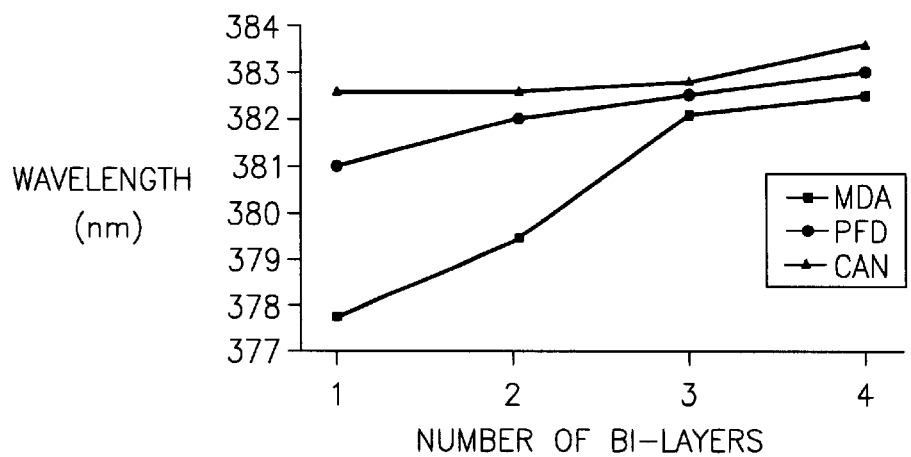
FIG.9
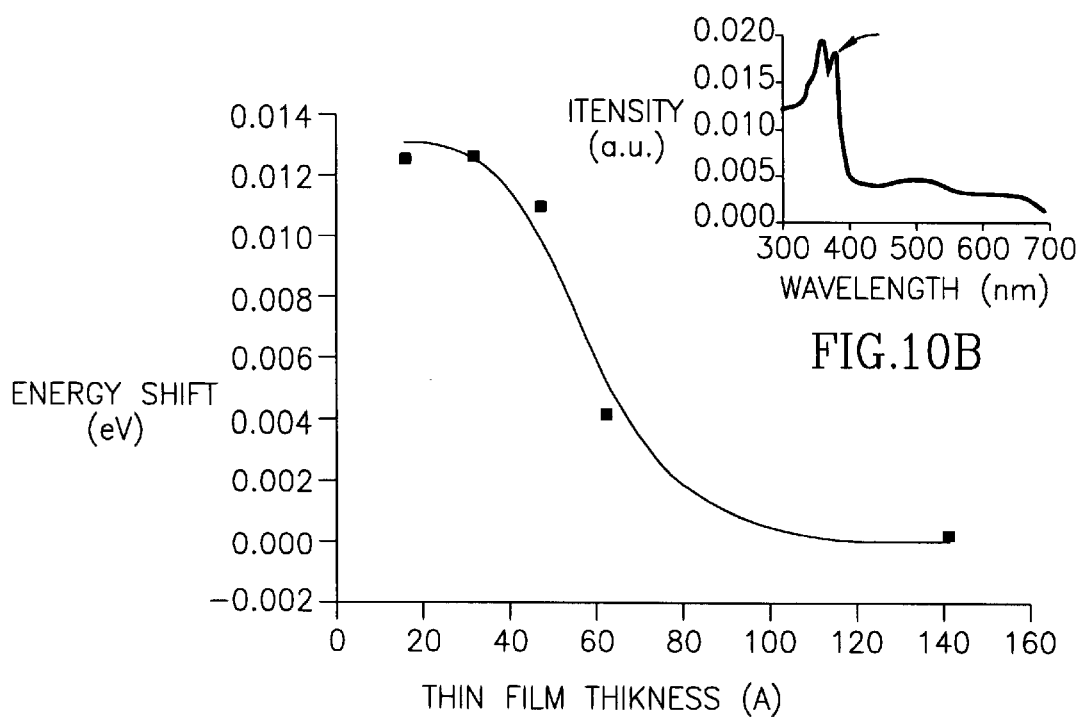
FIG.10B
FIG.10A

MOLECULAR LAYER EPITAXY METHOD AND COMPOSITIONS

This application claims the priority of U.S. Provisional Application No. 60/079,699 filed Mar. 27, 1998, which is incorporated herein by reference.

FIELD OF THE INVENTION

The present invention relates to molecular monolayer compositions and methods of forming the same.

REFERENCES

Anderson, H. L., et al.,*Angew. Chem. Int. Ed. Eng.* 33:655 (1994).
Bird, R. B., et al., in TRANSPORT PHENOMENA, Wiley, New York, N.Y. (1960).
Braun, D., et al., *Appl. Phys. Lett.* 58:1982 (1991).
Braun, D., et al., *J. Appl. Phys.* 72:568 (1992).
Burn, P. L., et al., *Nature* 356:47 (1992).
Burroughes, J. H., et al., *Nature* 347:539 (1990).
Chemla, D. S., et al., *IEEE J. Quantum Electron.* QE-20:265 (1984).
Donovan, K. J., et al., *Thin Solid Films* 232:110 (1993).
Donovan, K. J., et al., *Thin Solid Films* 244:923 (1994).
Forrest, S. R., et al., *Phys. Rev. B* 49:11309 (1994).
Greenham, N. C., et al., *Nature* 365:628 (1993).
Gresho, P. M., et al., in RECENT ADVANCES IN NUMERICAL METHODS IN FLUIDS, Vol. 1, Pineridge Press, p. 27 (1981).
Haskal, E. I., et al., *Chem. Phys. Lett.* 219:325 (1994).
Haskal, E. I., et al., *Phys. Rev.* B51:4449 (1995).
Hiramoto, M., et al., *Appl. Phys. Lett.* 62:666 (1993).
Hong, H., et al., *Appl. Phys.* 79:3082 (1996).
Jenekhe, S. A., and Osaheni, J. A., *Science* 265:765 (1994).
Kido, J., et al., *Appl. Phys. Lett.* 63:2627 (1993).
Kido, J., et al., *Appl. Phys. Lett.* 64:815 (1994).
Kubono, A., et al., *Prog. Polym. Sci.* 19:389 (1994).
Lam, J. F., et al., *Phys. Rev. Lett.* 60:1614 (1991).
Li, D., et al., *J. Am. Chem. Soc.* 112:7389 (1990).
Maruo, Y. Y., et al., *J. Vac. Soc. Technol. A* 11:2590 (1993).
Nalwa, H. S., *Adv. Mater.* 5:341 (1993).
Ohmori, Y., et al., *Appl. Phys. Lett.* 63:1871 (1993).
Osaheni, J. A., and Jenekhe, S. A., *Macromolecules* 27:739 (1994).
Pessa, M., *Appl. Phys. Lett.* 38:131 (1981).
Shirota, Y., et al., *Appl. Phys. Lett.* 64:807 (1994).
So, F. F., and Forrest, S. R., *Phys. Rev. Lett.* 60:2649 (1991).
So, F. F., et al., *Phys. Rev. Lett.* 66:2649 (1991).
So, F. F., et al. *SPIE* 95:(b)(13) (1990a).
So, F. F., et al., *Appl. Phys. Lett.* 56:674 (1990b).
Takahashi, Y., et al., *Macromolecules* 24:3543 (1991).
Tanaka, K., et al., *Synthetic Metals* 65:81 (1994).
Tatsuura, S., et al., *Appl. Phys. Lett.* 60:1661 (1992).
Ulman, A., in AN INTRODUCTION TO ULTRATHIN ORGANIC FILMS, Academic Press, New York, N.Y., Part 3 (1991).
Wang, X.-S., et al., *Jap. J. Appl. Phys.* 32:2768 (1993).
Yitzchaik, S., *J. Phys. Chem.* 97:6958 (1993).
Yoshimura, T., et al., *Appl. Phys. Lett.* 59:482 (1991).
Yoshimura, T., et al., *Appl. Phys. Lett.* 247:829 (1992).
Zakhidov, A. A., and Yoshino, K., *Synthetic Metals* 64:155 (1994).

BACKGROUND OF THE INVENTION

The interest in two dimensional (2D) materials results from the fact that optoelectronics and molecular electronics have become frontier areas of material science (Ulman, 1991). Multilayered organic structures have recently received theoretical (Lam, et al., 1991) and experimental (So, et al., 1991; Forrest, et al., 1994; Haskal, et al., 1994; Ohmori, et al., 1993; Yoshimura, et al., 1991; Yoshimura, et al., 1992; Donovan, et al., 1993; Donovan, et al., 1994) treatment. Novel and applicable photophysical properties of organic superlattices have been predicted, including enhancement of optical nonlinearities (Lam, et al., 1991; Zakhidov and Yoshino, 1994) and photoelectric transformations (Zakhidov and Yoshino, 1994). Techniques such as organic molecular beam deposition (OMBD) (So, et al., 1991; Forrest, et al., 1994; Haskal, et al., 1994; Ohmori, et al., 1993) have already proved the capability of growing ultrathin layers having the quality of inorganic quantum well (QW) structures.

A number of interesting optical and photophysical phenomena have already been found in OMBD derived organic QW, including the observation of exciton confinement in photoluminescence (PL) (So, et al., 1991; Forrest, et al., 1994) and electroluminescence (EL) and electric field modulation of PL (Ohmori, et al., 1993). Preparation of crystalline thin organic films by the OMBD relies on the bonding of molecular layers via weak van der Waals forces to achieve and preserve quasi-epitaxial structures (Forrest, et al., 1994). Thus, perfect monolayers without step edges cannot be achieved and the lower limit is an average of three "monomolecular" layers. A solution to these limitations can be found in another ultrahigh vacuum (UHV) technique: molecular layer deposition (MLD) (Yoshimura, et al., 1991; Yoshimura, et al., 1992). MLD demonstrated the construction of quantum dots and quantum wires and the potential use of functionalized organic precursors to form alternating multilayered structures. This approach is similar to (inorganic) atomic layer deposition (ALD) (Pessa, et al., 1981) and the solution analog-molecular self-assembly (MSA) (Ulman, 1991). MLD is now at a stage that challenges chemists to introduce new and efficient optoelectronically-active molecular precursors to such a process.

A solution derived method to produce 2D layered structures, the Langmuir-Blodgett (LB) technique, yields films exhibiting anisotropic electron transport (Donovan, et al., 1994) and tunneling (Donovan, et al., 1993), again suggesting QW behavior. While the LB method is useful in achieving 2D multilayered physiadsorbed structures, LB films suffer from low chemical and thermal stability and cannot incorporate large chromophores without phase-segregation and micro-crystal formation. Alternatively, the trichlorosilane-based MSA approach 1 provides the advantages of strong chemiadsorption through Si—O bonds, chemical and thermal stability, and the ability to form noncentro symmetric structures (Yitzchaik, et al., 1993; Li, et al., 1990).

Vapor phase growth techniques (Kubono, et al., 1994) such as vapor deposition polymerization (VDP) of thin films was recently demonstrated for aromatic polymers such as polyimides (Maruo, et al., 1993), polyamides (Takahashi, et al., 1991), polyureas (Wang, et al., 1933), and polyetheramines (Tatsuura, et al., 1992). In the VDP process, two types of monomers are evaporated onto the surface of a substrate in a vacuum chamber. Condensation or addition polymerization then takes place between deposited monomers to produce thin polymeric films. Thin polymer films of high quality and uniformity can be fabricated by this process (Maruo, et al., 1993; Takahashi, et al., 1991). Thermally stable piezo- and pyro-electrical properties were found in poled samples (Wang, et al., 1993). Moreover, electric field assisted VDP (in situ poling of hyperpolarizable monomers) was employed to fabricate electro-optic polymer waveguides (Tatsuura, et al., 1992).

SUMMARY OF THE INVENTION

In one aspect, the invention includes a method of forming a polymer structure composed of two or more discrete monomolecular layers, where at least one layer is composed of molecules of a selected polycyclic aromatic compound having a defined z axis oriented substantially upright with respect to the plane of the monolayer, e.g., normal to the plane, or within about 30° of normal. The method includes depositing molecules of a selected aromatic compound, preferably a polycyclic aromatic compound, having a defined z axis with a chemically reactive group at each axial end, by vapor phase deposition, onto a substrate having surface-reactive sites capable of reacting with the chemically reactive group in the selected compound. The deposition step is carried under conditions which allow chemiadsorption of the selected compound in a molecular monolayer, by covalent coupling of one end of the compound to the substrate, and sublimation of non-covalently bonded compounds from the surface. There is formed by the deposition step a monomolecular layer of the selected compound characterized by in-plane compound ordering. These steps are one or more times, where the monomolecular layer formed at each deposition cycle forms a new substrate having a surface-exposed monolayer with exposed reactive groups.

In one general embodiment, the method includes reacting the surface-exposed monolayer with a bifunctional reagent that reacts with the exposed reactive groups forming the just-deposited layer, to produce a coupling layer having exposed reactive groups with which the reactive groups of the selected compound forming the next monolayer can react.

For example, the surface-reactive groups on the substrate may be amine groups, and the bifunctional reagent may be a diamine compound. In this embodiment, the selected compound may be, for example, a polycyclic tetracarboxylic-dianhydride compound, capable of forming axial-end imide linkages, a polycyclic diacyl halide, capable of forming axial-end amide linkages, a polycyclic dialdehyde, capable of forming axial-end Schiff base linkages, and a polycyclic diisocyanate, capable of forming axial-end urethane linkages.

The deposition in such an embodiment may be carried out, for example, N times in succession with one selected polycyclic compound, and M times in succession for a second selected polycyclic compound, to form a N monolayers of the one compound, and M monolayers of the other compound. The first and second polycyclic may be, for example, perylene and naphthalene compounds, respectively.

Alternatively, in the embodiment, the deposition steps may be carried out N times in succession for a first selected polycyclic compound, and one or more times in succession for the bifunctional reagent.

In another general embodiment of the method, the surface-reactive groups on the substrate are maleimide groups, the selected compound is a polycyclic compound with z-axis amine groups, such as a diaminocarbozole, and the bifunctional reagent is a bismaleimide compound.

The method is useful for example, in forming organic monolayers in an organic light-emitting diode (OLED), an OLED array, non-linear optical devices, photoreceptors, waveguides, and a supercapacitor.

In another general embodiment, the invention includes a polymer structure comprising (i) a substrate, (ii) a first monomolecular layer composed of monomers of a selected aromatic compound, preferably a polycyclic compound, having a defined z axis oriented substantially upright with respect to the plane of the monolayer, e.g., normal to the plane, or within about 30° of normal, with the monomers forming the monolayer being covalently attached at one axial end to the substrate, and (ii) a second monomolecular layer composed of monomers of a selected polycyclic aromatic compound having a defined z axis oriented substantially normal to the plane of the monolayer, with the monomers forming the monolayer being covalently attached at one axial end an axial end of molecules forming the first monolayer. Exemplary monolayer compositions are as above.

The compositions find applications, for example, in organic monolayers in an organic light-emitting diode (OLED), an OLED array, non-linear optical devices, photoreceptors, waveguides, and a supercapacitor.

These and other objects and features of the invention will become more fully apparent when the following detailed description of the invention is read in conjunction with the accompanying drawings.

BRIEF DESCRIPTION OF THE DRAWINGS

FIG. 9 is plot of UV absorption maxima of NTCDI as a function of bilayer numbers with different organic spacings;

FIG. 10A shows the energy shift of the NTCDI-DAH superlattice absorption peak, marked by arrow in the insert (10B) graph, as a function of superlattice thickness, where the symbols correspondent to experimental data, and the solid curve is the fit using the model described in the text, and where the 10B insert shows the absorption spectrum of a NTCDI-DAH multilayer sample;

DETAILED DESCRIPTION OF THE INVENTION

This invention addresses the need for new approaches to multifunctional organic surface structures by developing concepts, methods, and molecular building blocks with covalent bonding as a unifying theme. Typically large disc-like p-conjugated organic molecules (perylene, naphthalene, and triarylamine derivatives) are covalently attached to the surface. The driving force for face-to-face packing is p-stacking and hydrophobic interactions. Assembling these 2D layered structures from the vapor-phase is assisted by a template layer dictating epitaxial growth.

Employing the method of the invention, organic multiple quantum wells (OMQW) structures and superlattices were assembled. In these quantum confined structures, directional charge injection and charge confinement were achieved and manipulated for uses in specific photo-electronic applications. A novel approach to quantum confined organic light emitting diodes (LED's) was demonstrated. Full characterization of the structures, photophysical, electronic, and optically nonlinear properties of the superlattices is an essential aspect of the invention.

A. Reactor and Reactor Conditions

Figure 1:
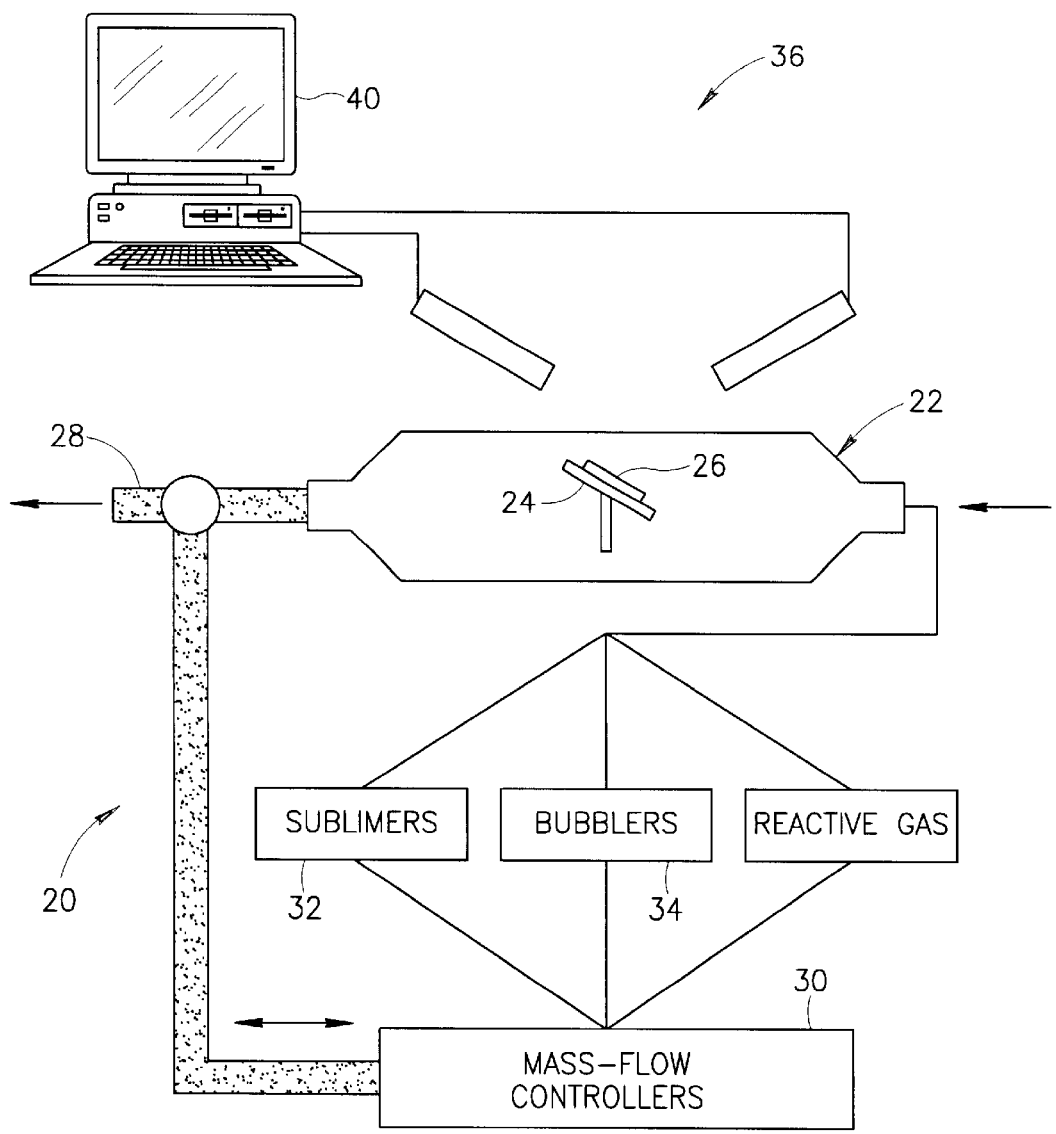
FIG. 1 is a schematic drawing of a CV-MLE reactor useful in practicing the method of the invention.

FIG. 1 shows a reactor 20 for use in practicing the chemical vapor deposition-molecular layer epitaxy (CVD-MLE) method of the invention. The reactor includes a chamber 22 housing a sample-holder 24 designed to hold and heat to a desired temperature, a sample substrate 26. The reactive molecules to be deposited, in vapor phase are carried through the chamber on a carrier gas, e.g., argon, in a right-to-left direction in the figure, under the influence of a vacuum source 28. A mass-flow controller 30 in the apparatus controls the production of reactive gas, at a sublimer 30, where the gas is mixed with argon through a bubbler 34, for introduction into the chamber. The deposition of a layer on the substrate is monitored by an in situ spectroscopic ellipsometer, under the control of a unit 38, with visual display 40. One exemplary reactor is a commercially available MDS CO reactor equipped with an M-44 Woollam Vo. spectroscopic ellipsometer.

Laminar flow in a low pressure CVD reactor is considered to be a precondition of high-rate growth of textured films in deposition of inorganic semiconducting and superconducting films. Convection effects are particularly important in low pressure CVD, where mass transfer usually controls the deposition rate. We calculate our aspect ratio for horizontal laminar flow MLE-CVD reactor based on methods described out in Bird, et al. (1960) and in Gresho, et al. (1981). In the frame of those methods the following simplifications were made: (i) the film growth rate is slow compared with the gas phase dynamics, so the gas phase may be in pseudo steady-state, i.e. the time derivatives in the momentum, energy and species balance may be set to zero; (ii) longitudinal diffusion of momentum is small in comparison with advection and that pressure variations in the axial direction are large compared to pressure variations in the transverse direction.

The prototype system was based on the following reaction conditions: the reactor walls were heated to avoid molecule condensation on the walls; the CVD was operated in the pulse mode; the chamber base pressure was $10^{-5}$ Torr, operation $1-100\times10^{-3}$ Torr; temperature of the sample holder about 130–450° C., e.g., 325° C., temperature of the reactor walls, 100–400° C., e.g., about 250° C.; temperature of the sublimers, 35–300° C., temperature of the bubblers, 3–80° C., time of each puls, 3–15 minutes, cleaning pulse with argon, about 3 minutes. The final chosen dimensions of reactor were aspect ratio: 1:3, length:height ratio: 1:7. The usual value of linear expansion angle of 7 degrees was accepted to avoid expansion of steady non-uniform gas flow. The susceptor was tilted 6 degrees to decrease the effective cross section of the cell. This increases the gas velocity, thus reducing the boundary layer thickness and increasing the growth rate.

The vaporization of VDP monomers (aromatic-diamines, -dianhydrides and -diisocyanates) has been studied. Assuming Langmuir behavior (neglecting diffusion) the saturated vapor pressure ($10^{-3}$ Pa) was evaluated from the evaporation rate. Comparing the vapor pressure values of these VDP monomers to those of metal-organic chemical vapor deposition MOCVD precursors, ($10^{-2}$ Torr) under the same experimental conditions suggests that they have comparable volatility. Most VDP processes involve a direct monomer sublimation onto the substrate surface under ($10^{-5}$ to $10^{-8}$ Torr) UHV conditions. On the other hand, MOCVD is usually carried out with only moderate vacuum (0.1–10 Torr), using a carrier gas to transport precursors to the substrate via hydrodynamic flow. Diffusion through a boundary layer brings the precursors into direct contact with the substrate. Therefore, the growth rate depends largely on either diffusion to the substrate or the reaction kinetics at the surface.

In the CVD-MLE invention, carrier-gas assisted organic chemical vacuum deposition (OCVD) at lower pressures ($10^{-2}$ to $10^{-4}$ Torr), is employed. The validity of operating under such conditions is supported by the fact that plasma polymerization of one of the proposed monomer (i.e., see next PTCDA) has been conducted under $10^{-2}$ Torr with Ar as a carrier gas (Tanaka, et al., 1994). Therefore, an MLE reactor (FIG. 1) was designed and built in order to have a tailorable yet reproducible means of film deposition. This reactor is capable of large scale production and was also used for device fabrication.

B. Template Layer

The crucial parameter in monomolecular deposition from the vapor phase is the surface energy of the substrate. That is, a weak interaction between molecules and the substrate will accelerate re-evaporation. In order to increase adsorption of the first monomer onto the surface a new concept in thin film deposition from the vapor phase is employed: the introduction of a template layer. A template layer is composed of self-assembled monolayer deposited from solution or vapor phase, which exposes a reactive functionality toward the first monomer. This template layer dictates epitaxial growth and ensures self-limiting growth of only one monolayer. Therefore, this step bridges solution and vapor phase growth mechanisms in a unified concept.

Figure 2:
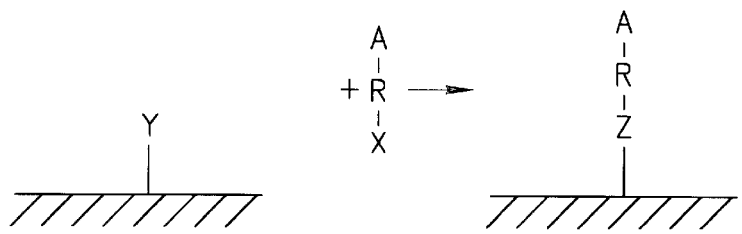
FIG. 2 illustrates various chemical derivatization reactions for forming a surface reactive template layer with aliphatic or aromatic reactive groups.

FIG. 2 illustrates one general scheme for preparing a substrate 42 with surface amine groups, to serve as the template layer for monomolecular layer growth on the substrate. In this scheme, Y is a surface MeOx surface group (Table 1). The substrate is reacted with the compound X—R—A, where X, R, and A are the chemical groups indicated in Table 1. As can be appreciated from the table, the reaction forms a template layer with exposed $NH_2$, NH, or OH groups, and formed of aliphatic or aromatic R moieties.

Figure 3:
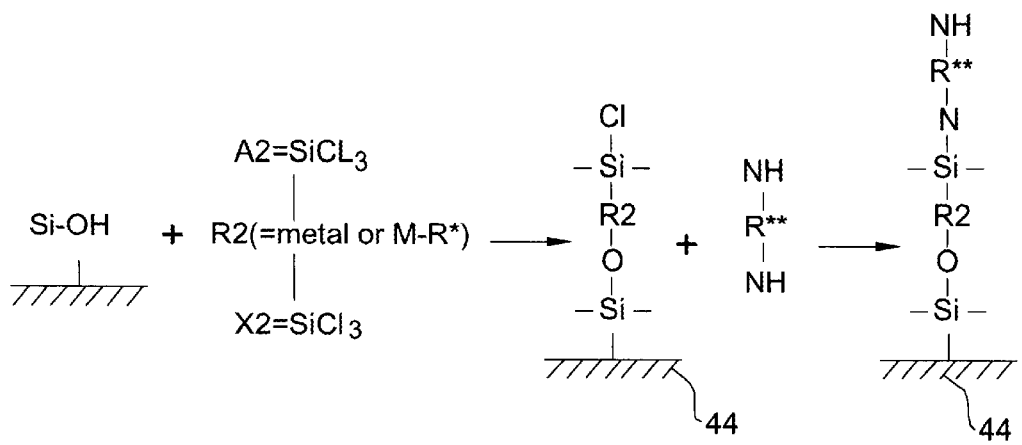
FIG. 3 illustrates various chemical derivatization reactions for forming a surface reactive template layer with inorganic or metalloorganic reactive groups.

FIG. 3 illustrates the formation of a template layer with exposed metal halide groups, with the template layer being formed of inorganic or metalloorganic moieties on a metal oxide substrate. Here a compound X2—R2—A2, where X2, A2, and R2 are given in Table 2, is reactive with a metal oxide surface of a substrate 44, under either vapor deposition or solution reaction conditions.

C. Molecular Monolayer Formation

Initially, a clean hydroxylated metal-oxide surface, such as $SiO_2$, $TiO_2$, $Al_2O_3$, or ITO, is converted to an aminated surface by a solution phase reaction, e.g., with 4-aminobutyltrimethoxysilane (FIG. 3). After the template layer is deposited all of the following film growth steps are conducted under CVD-MLE conditions.

Figure 4A:
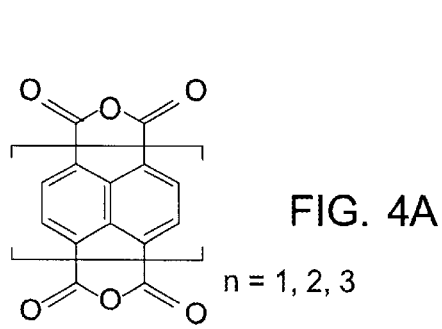
FIGS. 4A–4C illustrate exemplary aromatic monolayer compounds useful in forming organic superlattice structures in accordance with the invention.

FIGS. 4A–4D illustrate various polycyclic or linked ring aromatic compounds suitable for use in forming the initial monomolecular layer of aromatic monomers on the template layer. In FIG. 4A, the compound is a naphthalene (n=1), perylene (n=2) or terylene (n=3) tetracarboxylic dianhydride compound, having a z axis that extends through the two ring oxygen groups. Thus, the compound has reactive anhydride groups at axial ends of the molecule. During vapor-phase deposition, one end of the molecule reacts with template layer amine groups to form a surface imide linkage, as illustrated in FIG. 5A.

Figure 4B:
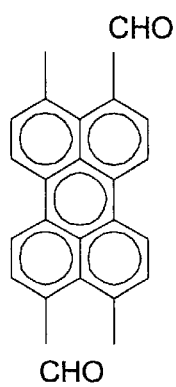
Figure 5A:
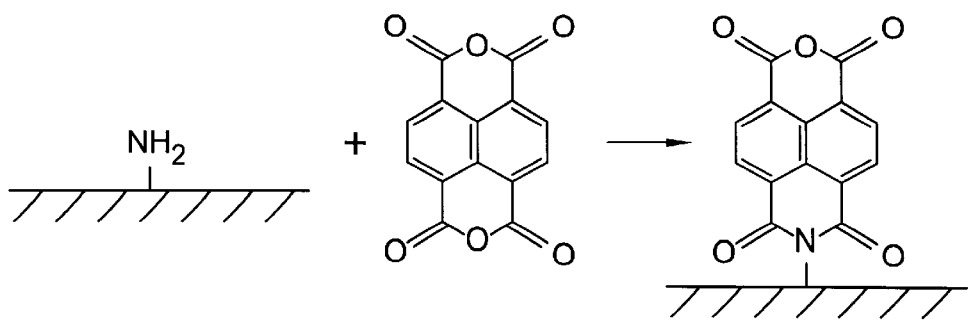
FIGS. 5A–5D illustrate exemplary aromatic monolayer compounds and corresponding bifunctional coupling compounds useful in forming organic superlattice structures in accordance with the invention.
Figure 5B:
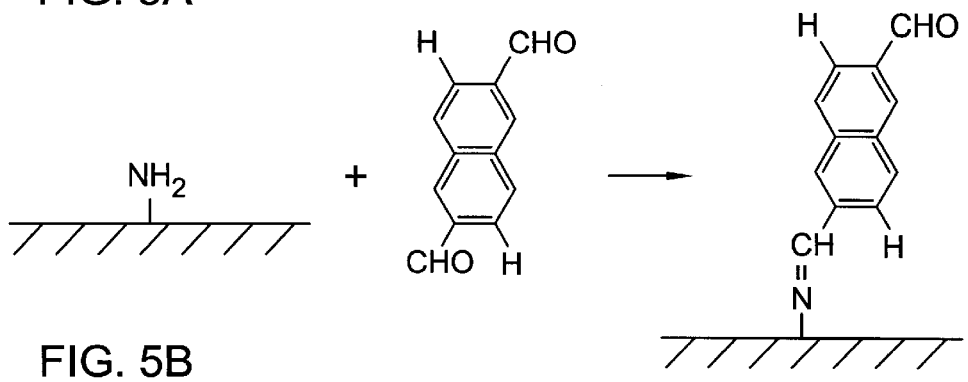

FIG. 4B shows a polycyclic aromatic compound having axial aldehyde groups that can react with a template layer amine groups to form covalent Schiff base linkages between the template and compound, as illustrated in FIG. 5B.

Figure 5C:
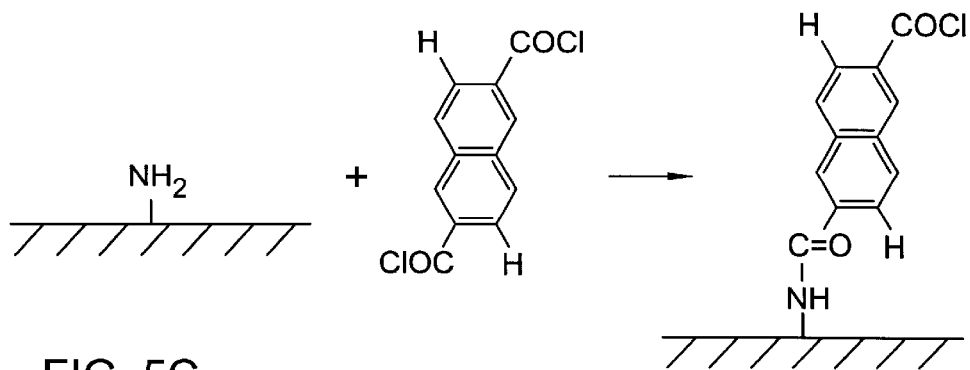
Figure 5D:
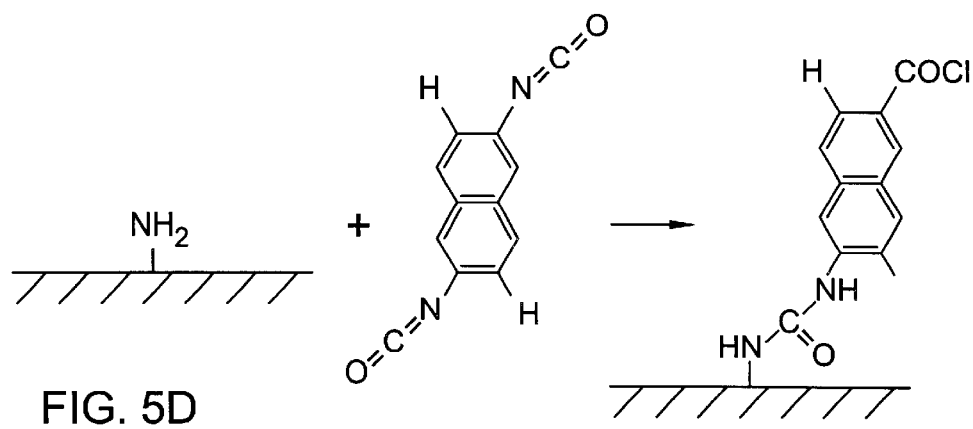

FIG. 5C and 5D illustrate other polycyclic compounds having axial-end reactive groups, and their reaction with template layer amine groups to form covalent linkages to the template layer exposed amine groups.

Figure 4C:
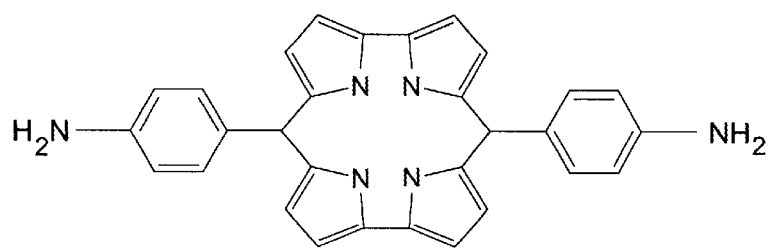

Finally, FIG. 4C shows a aromatic compound with axial end amine groups, for reaction with, for example, template-layer anhydride, aldehyde, acyl halide, isocyanate, or maleimide groups, for covalent attachment of one template end to the exposed reactive groups in the template layer. Examples of polycyclic compound with axial-end amines, and their reaction with maleimide template groups, will be described below.

D. NTCDA/DAH Superlattice

Figure 6:
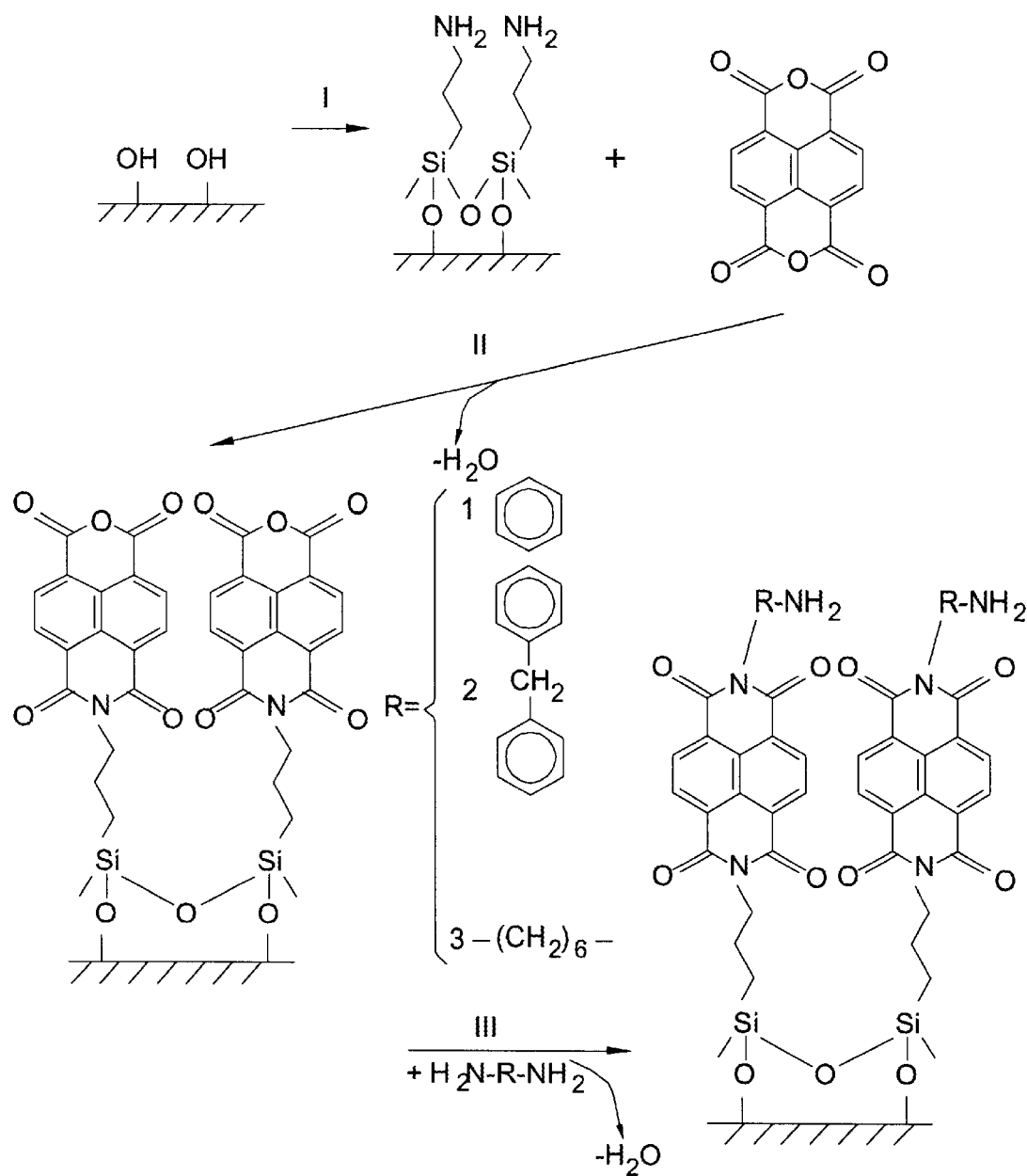
FIG. 6 illustrates steps in forming a perylene/naphthalene superlattice in accordance with the invention.

FIG. 6 illustrates steps in forming a multilayer of 3,4;9,1--naphthalene tetracarboxylic-dianhydride, NTCDA, structure, where each monolayer is linked by 1.6 diamine hexane groups (DAH). In the first step, a template layer with exposed amine groups is formed on metal or silicon oxide substrate. The surface is reacted, under CVD-MLE conditions to form the first monolayer or aromatic compounds on the template layer. During the deposition, vapor-phase molecules react covalently with the template reactive groups, to attach a monolayer of the compound over the template layer, at one axial end of the compound molecules. This axial orientation, coupled with pi-stacking forces, acts to orient the molecules with the z axes substantially upright with respect to the surface of the substrate, e.g., with the molecules' z axes within about 30 degrees to normal to the monolayer plane, in a close-packed arrangement. At the same time, the heated (e.g., 325° K) template surface acts to sublime off non-covalently bound compound, resulting in a close-packed monolayer of the compound, that is epitaxial deposition of an organic monolayer on the substrate.

Reaction with vaporized aliphatic- or aromatic-diamine (step iii) then regenerate an aminated surface ready for the next insertion. As indicated in FIG. 6, steps ii and iii in the figure may be repeated N times to form N stacked monolayers of the selected polycyclic aromatic compound, in this case, naphthalene.

Figure 7:
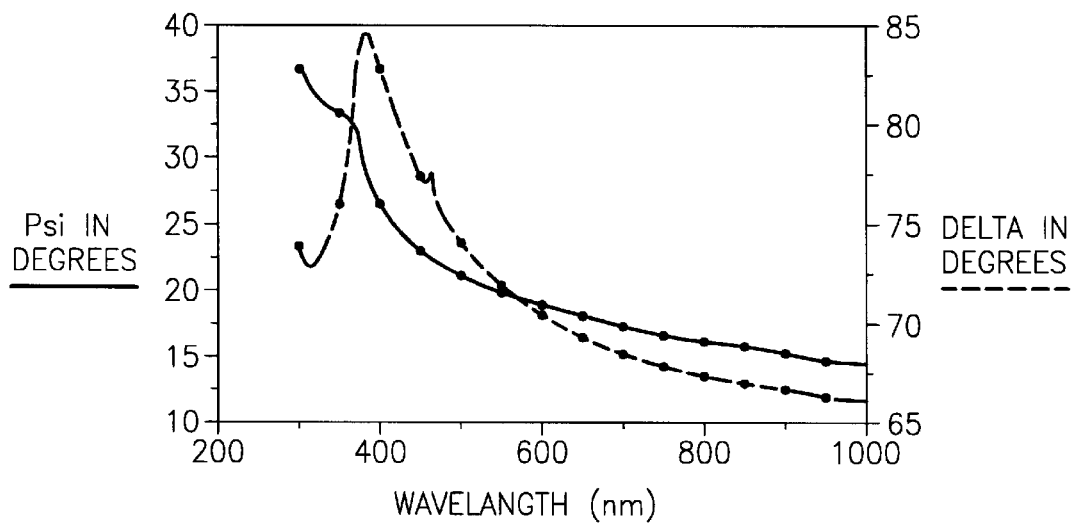
FIG. 7 is a plot of generated and experimental ellipsometric data for 9 bilayers of NTCDI-DAH formed in accordance with the invention.

FIG. 7 shows measured and fitted ellipsometric data for a superlattice with n=9 (NTCDI-DAH)n structure, where n is a number of bi-layers and each bi-layer contains one monolayer of NTCDI and one of DAH, oriented in c-axis. As seen, there is a good fit between experimental data and the generated model, with mean squared error (MSE) fitting parameter less than one. Molecular c-axis interplanar spacings are: 9.61 Å for NTCDI and 6.19 Å for the hexamethylene spacer. Difference in the interplanar spacing obtained by MBE stacking deposition (3.506 Å for NTCDA) and CV-MLD is the difference between van der Waals stacking and covalently bonded c-axis CV-MLD thin film growth. The structural parameters of the model were confirmed by comparison with XRD data of a model compound N, N-dihexyl-NTCDI [16] reproducing the same superlattice interlayer spacing on molecular level and also with NTCDA crystallographic data (17). Contact angle was measured after every deposition step. Contact angles were: 15.5° for SiO2/Si and 65°, 92° and 70° after steps i–iii, respectively. Values of contact angle for (NTCDI-DAH)n thin films for steps ii–iii were reproducible up to n=9. The growth of the contact angle value corresponds to hydrophobic changes of growing interface.

Figure 8:
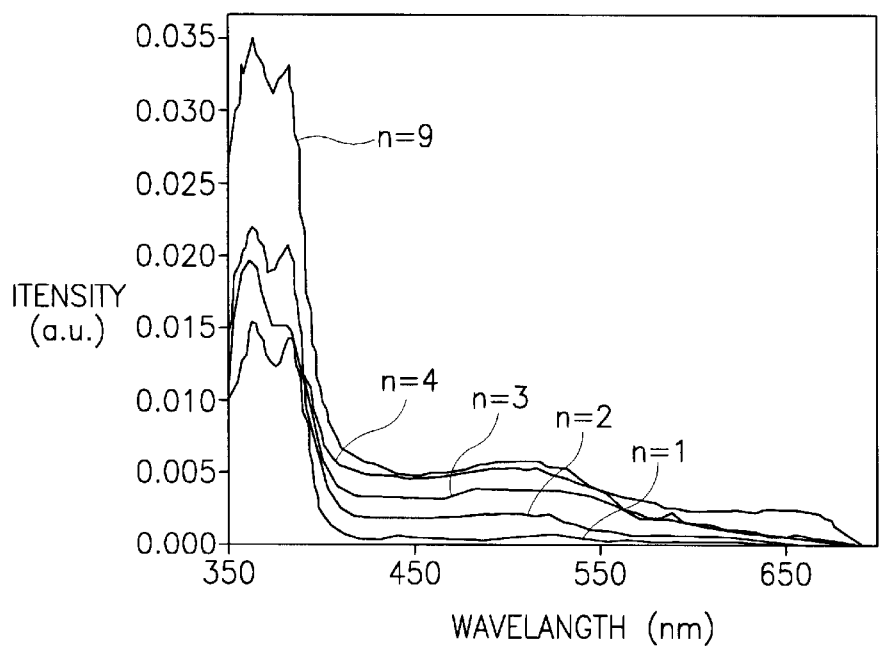
FIG. 8 shows UV-V absorption spectra of different thicknesses of (NTCDI-DAH) ultra-thin films.

FIG. 8 shows UV-Vis absorption spectra of (NTCDI-DAH)n superlattice as a function of bi-layer number. Optical density of those films at 360nm, and 383 nm and 522 nm shows monotonic growth with increasing numbers of NTCDI-DAH bi-layers. We attribute UV peaks at 360 and 383 nm to isolated NTCDI absorption and broad peak around 522 nm to in-plane pi-stacking absorption respectively. The broadening of the visible part of the spectra corresponds to generalization of electrons with different energies capable of passing the bandgap in in-plane direction. However, when n=9 the superlattice field in perpendicular direction is sufficient to influence on p-conjugated electrons band around 520 nm is clearly observed for films with n=9.

Blueshift of 380 nm UV peak position appeared at decreasing the numbers of deposed bi-layers, which was predicted and observed for organic superlattices [17] is shown in FIG. 9 for different spacers. The UV band at around 380 nm for one bi-layer is shifted to higher wavelength number as superlattice thickness increase. This blueshift in the exiton energy in NTCDI may be due to molecular polarization in the presence of an exciton which extends into the NTCDI-DAH in the multilayer structure. Alternatively, the exiton energy shift can be due to the change in exciton binding energy as a result of quantum confinement (Kido, et al., 1993; Shirota, et al., 1994).

E. Quantum Confinement in Organic Multilayers

Evidence of quantum confinement of extended charge transfer states in organic multilayer structures was previously provided by So and Forrest (1991), Haskal, et al. (1995) and Hong, et al. (1996). It was observed that the lowest-energy absorption peak (So, et al., 1990; So, et al., 1991), the ground state vibration frequency (Haskal, et al., 1995) of exciton fluorescence spectra, and exciton photoluminescence peak (Kido, et al., 1994; Hiramoto, et al., 1993) shift to higher energies as the layer thickness decreased. The blueshift observed in FIG. 9 in the exiton energy in NTCDI can be due to molecular polarization in the presence of an exciton which extends into the NTCDI-DAH in the multilayer structure. Alternatively, the exiton energy shift can be due to the change in exciton binding energy as a result of quantum confinement (Bird, et al., 1960).

In order to establish the nature of this blueshift the energy shift of the NTCDI-DAH superlattice absorption peak DE as a function of superlattice thickness was calculated. FIG. 10A shows energy shift of the NTCDI-DAH superlattice absorption peak, marked by arrow in the insert graph (FIG. 10B), as a function of superlattice thickness. The symbols correspond to experimental data and solid curve is the fit to the model. The observed thickness dependence, proportional to $t^{-5}$, can be explained by confinement of the exiton in a narrow potential well consisting of a NTCDI layer bonded by two DAH layers (So, et al., 1990a, 1990b).

F. Mixed Layer Structures

To form monolayers of a different selected compound, steps ii and iii in FIG. 6 are repeated, except with a different compound, e.g., 3,4;7,8-perylene tetracarboxylic dianhydride, PTCDA. Repeating steps ii–v several times lead to the formation of polyimide-based superlattices with alternating chromophores. Film growth is monitored in situ by a spectroscopic ellipsometry.

These structures of alternating chromophores arrays having different electron affinities yield organic quantum confined structures. PTCDA can be regarded as an electron sink (a deep potential well) where trapped electrons in the form of radical-anions are stabilized by the carbonyls on the periphery of the large perylene p-system. Electron barriers in this case are chromophores with lower electron affinity, NTCDA, or molecular insulators such as linear alkyl chains. Controlling the heterostructure well "depth" or barrier "height," is accomplished by varying the number of times steps ii–iii (for wells) and iv–v (for barriers) are repeated. Furthermore, these quantum confined layers (each composed of several monolayers) can be separated one from each other by different alkane chain length ([CH2]n, n=2–20; in steps iii or v). This provides a powerful tool for investigation of anisotropic electron transfer and tunneling. PTCDA and NTCDA were selected as the first model system for this study because this pair was used in the first successful demonstration of an OMBE derived OMQW. This also demonstrates the superior performance of the covalent MLE approach vs. the UHV-technology based van der Waals quasi-epitaxy approach.

G. Carbazole Based Superlattices

Figure 12:
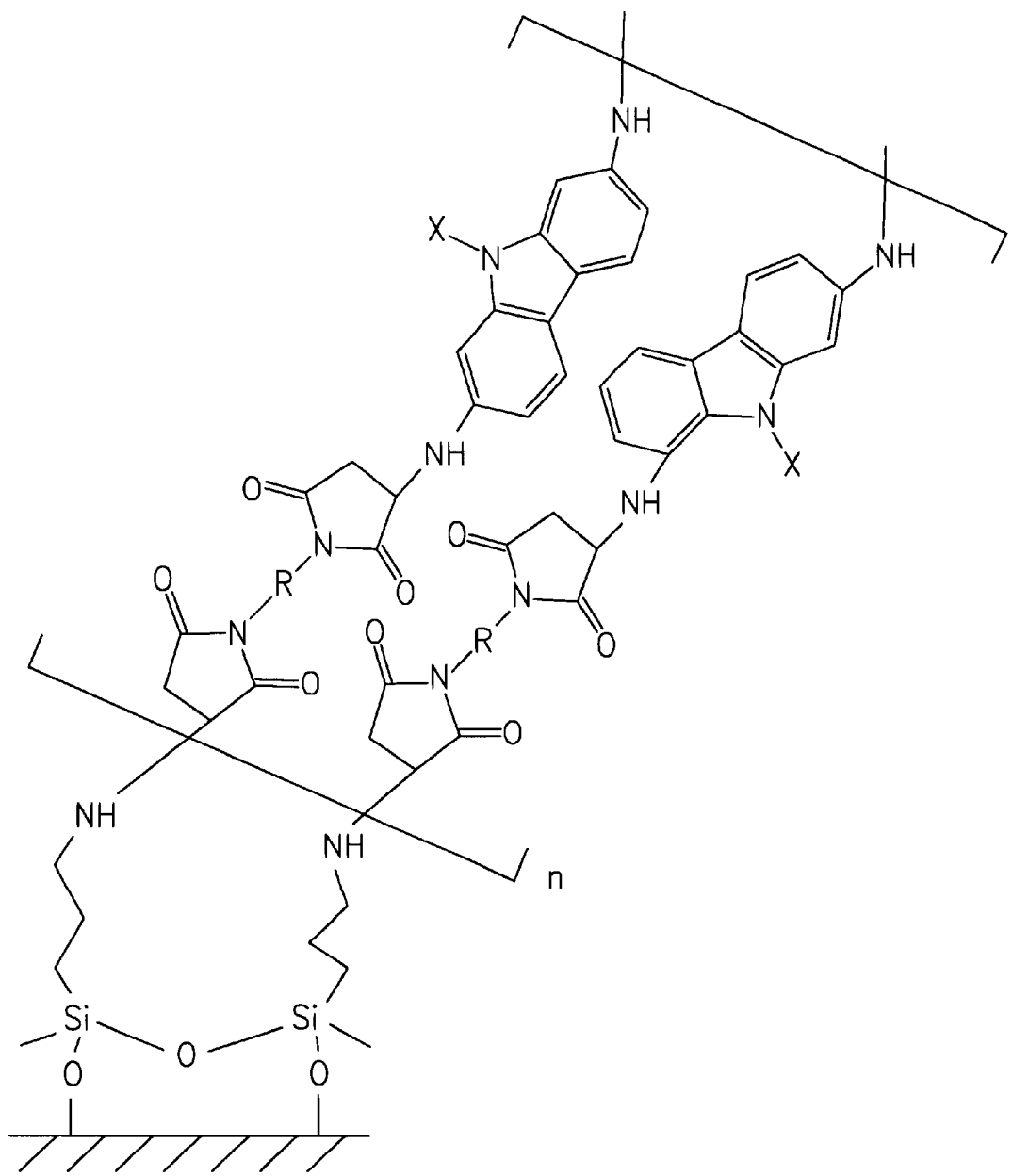
FIGS. 12 illustrates a scheme for carbazole, bismaleimide multilayers, in accordance with the invention.

Substituted triarylamines function as an excellent hole transport material for organic LED (20). Poly(N-vinylcarbazole) exhibited, in addition to its ability of hole transporting, an advantageous properties as a blue-light emitter in organic LED (Kido, et al., 1993; Shirota, et al., 1994). The second MLE system is based on molecular building blocks with hole transport ability. Utilizing the same synthetic strategy presented for FIG. 6, structures such as in FIG. 12 are synthesized. Vaporization of alkyl- or aryl-bimaleimide onto propyl-amine containing template layer results in the Michael addition product. This step exposes maleimide functionality ready to react with different diamino-carbazole derivatives.

After the carbazole unit is introduced an amine functionality is exposed out of the syrface allowing repitition of the process toward multilayered structures. The various carbazole N-substituent (X in FIG. 12) are introduced at divergent layers to form a hole-affinity gradient in the multilayered structure. Improvement of the electron donating ability of the substituents (in this case: going from hydrogen to phenyl to mesityl substituent) increases the hole affinity of the molecule.

H. Vacuum Deposition Polymerization, VDP

The efficiency of film growth rate from the vapor phase to a solid substrate, as already mentioned, is determined by the ratio between adsorption and desorption (the sticking coefficient). Up until now this aspect was only addressed with alternating substrates and by modulating the VDP deposition conditions (Greenham, et al., 1993; Burn, et al., 1992; Burroughes, et al., 1990). Prefunctionalization with an organic coupling layer, as with MLE, will afford a better control over surface reactivity. New reactive and volatile optoelectronically active precursors will be tailored to satisfy this requirement. This polymerization route will lead to extremely interesting macromolecules, ladder and rigid-rod semiconducting polymers, that are inaccessible via solution chemistry.

Figure 13A:
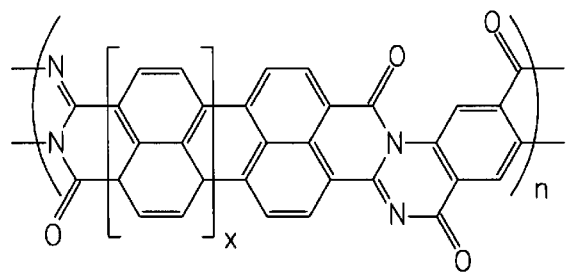
FIGS. 13A–13C illustrate various polymer structures that can be generated in accordance with the method of the invention.

The ladder perylene derived P1 and naphthalene derived P2 polymers (FIG. 13A), poly(isoindoloquinazolinedione)s, can be synthesized by vaporizing both comonomers onto an alkylamine functionalized substrate. Reaction of NTCDA or PTCDA with 1,4-diamino-2,5- diamidobenzene afford electronically double stranded conjugated skeletons combined with extremely stable ladder structure.

Figure 13B:
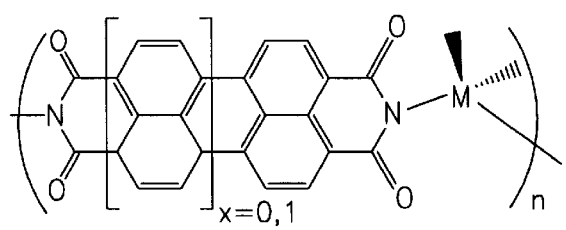

Organometallic silicon or germanium containing polymers, naphthalene-derived P3 and perylene-derived P4 (FIG. 13B) are prepared by depositing either monomer on aminated surfaces. NTCDA or PTCDA is converted to the free imide and then sublimed together with R2SiCl2, where R is a linear or a branched alkyl substituents. This class if polymetalloarylenes is unique due to the bridging mode of two luminophores directly by one metal center.

Figure 13C:
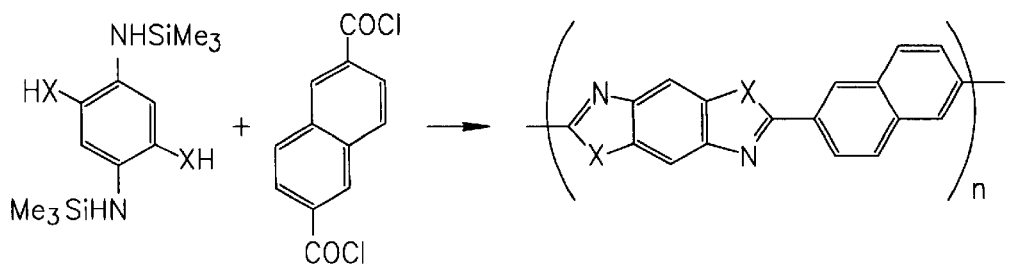

The rigid-rod polymers, poly (2,6-naphthalene-benzoaxazole) P5 and poly(2,6-naphthalene-benzhithalene-benzthiazole) P6 (FIG. 13C) are prepared by subliming the corresponding precursors onto an alkylamine functionalized surface. Insertion of different aromatic units into oxazole or thiazole containing polymers is demonstrated for the benzene derivative.

I. Applications: OLED

Figure 17A:
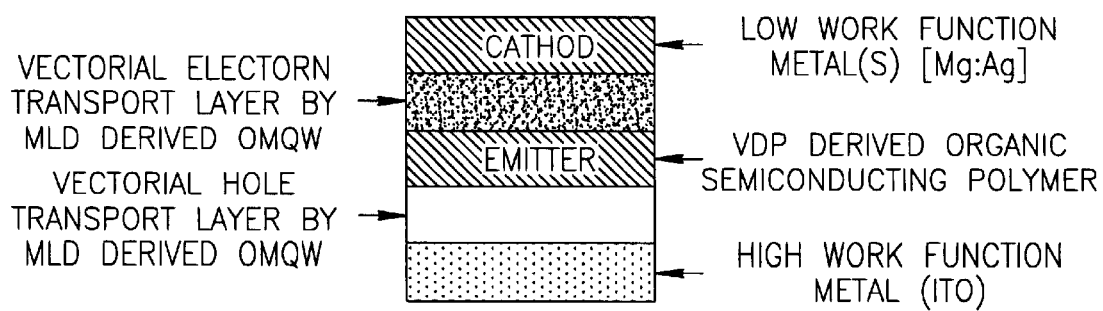
FIG. 17A shows the layers in an optical light-emitting diode (OLED) constructed in accordance with the invention.
Figure 17B:
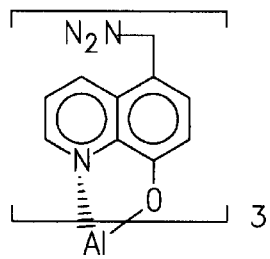
FIG. 17B shows a scheme for attaching an aromatic amine group to an aluminum surface, in the OLED of FIG. 17A.

Conjugated polymers or molecular stacks are organic semiconductors by virtue of the delocalization of the p molecular orbitals along the polymer chain or in the stacking direction. Such materials frequently exhibit electroluminescence (EL) when incorporated into a device (Greenham, et al., 1993; Burn, et al., 1992; Burroughes, et al, 1990; Kido, et al., 1994; Hiramato, et al., 1993; Braun, et al., 1991; Braun. et al. 1992; Jenekhe, et al. 1994; Osaheni and Jenekhe, 1994). In light-emitting diode (LED) device, excitation is caused by the injection of an electron into the conduction band (LUMO) and a hole into the valence band (HOMO) which recombine with emission of visible light. An optimal LED device (FIG. 17A) should exhibit efficient charge injection (electrons and holes) at the metal/organic-layer interface, good charge transport, and efficient radiative charge-recombination. Exemplary materials are: and upper aluminum contact cathode, NTCDI as the electron transport layer, PTCDI as the emission layer, triarylamine, diaminocarbazole, or diphenylamine as the hole transport layer, and indium-tin-oxide as the high work function metal. FIG. 17B illustrates a cathode template layer, showing the binding of an aromatic amine to an Al surface.

All of the monomolecular layers are assembled using CVD-MLE in a covalently bonded epitaxial z-oriented structure. The EL in the NTCDI structure is thickness/voltage tunable, and using different thicknesses of NTCDI, different color luminescence, e.g.,red, blue, and green, can be achieved.

More generally, a unidirectional charge injection is obtained in a multilayered structure by assembling an energy-gap gradient of tailored chromophores with hole or electron affinity. Improvement of electron injection is achieved simply by assembling NTCDA/PTCDA beneath the cathode. Fine tuning is achieved by superlattice construction (semiconductor/insulator) with the NTCDA layer thicknesses increasing (energy-gap decreases) toward the emitter. Additionally a second PTCDA superlattice with a lower energy-gap gradient can be introduced to "smooth" the electron injection energy levels from the metal electrode toward the emitter. The same concept can be applied for improvement of hole injection utilizing triarylamine multi-layer scheme where tunability of the hole affinity is feasible. Multilayers containing different N-substituted carbazoles at each layer are used to form an energy-level gradient from the anode toward the emitter and thus is expected to enhance hole injection. Both processes should lower the operating bias voltage of a device and therefore increase its stability. Better emitter layers and EL quantum efficiencies are expected from OMQW due to confinement of charges into the well. This will enhance the probability of radiative charge recombination. Moreover, tunability of the emitted light wavelength would be achieved by manipulating the well thicknesses. Additionally, heterojunctions between two emitting-layers, such as OMQW and semiconducting polymers, will allow control over the emitted light through the different bias voltage threshold of the different structures.

Finally, enhancement of EL quantum efficiency due to exciplex formation has recently been observed (Jenekhe, et al. 1994; Osaheni and Jenekhe, 1994) in a bilayer emitting configuration composed of donor-type emitters and acceptor-type emitters. The exciplex is, of course, formed at the interface. Thus, increasing the number of interfaces per unit volume is demanded for such a scheme. The synthetic methods of the present invention suggest a straightforward solution. These donor/acceptor multiplayer-structures (e.g. carbazole/PTCDA bilayers) serve as an avenue for exploring excitonic interfacial states and their applicability in light-emitting device-prototypes.

Figure 11A:
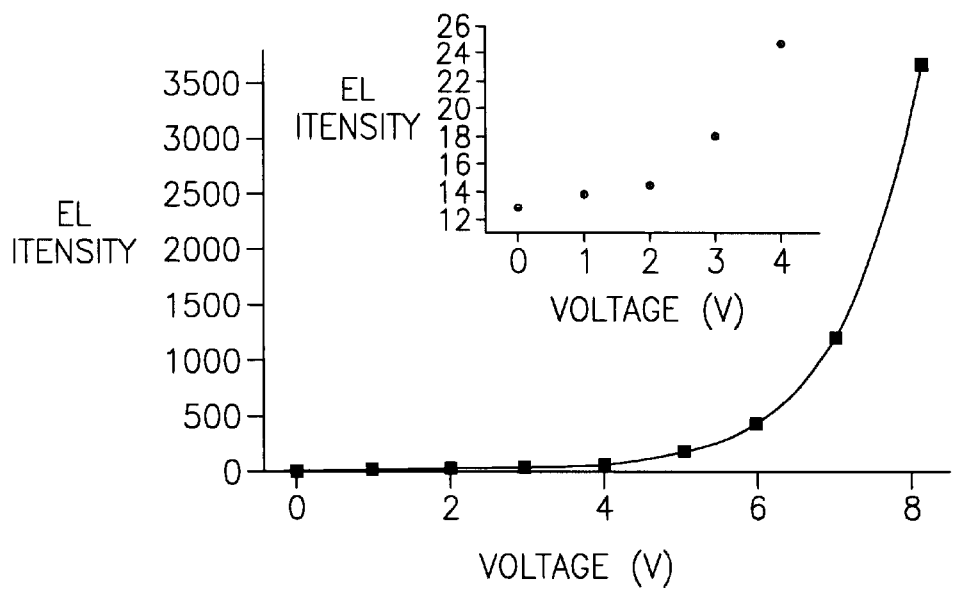
FIGS. 11A and 11B are plots of voltage-dependent EL (11A) and current (11B) for naphthalene based superlattice device, wherein the insert shows the EL-voltage dependence in a low DC field.
Figure 11B:
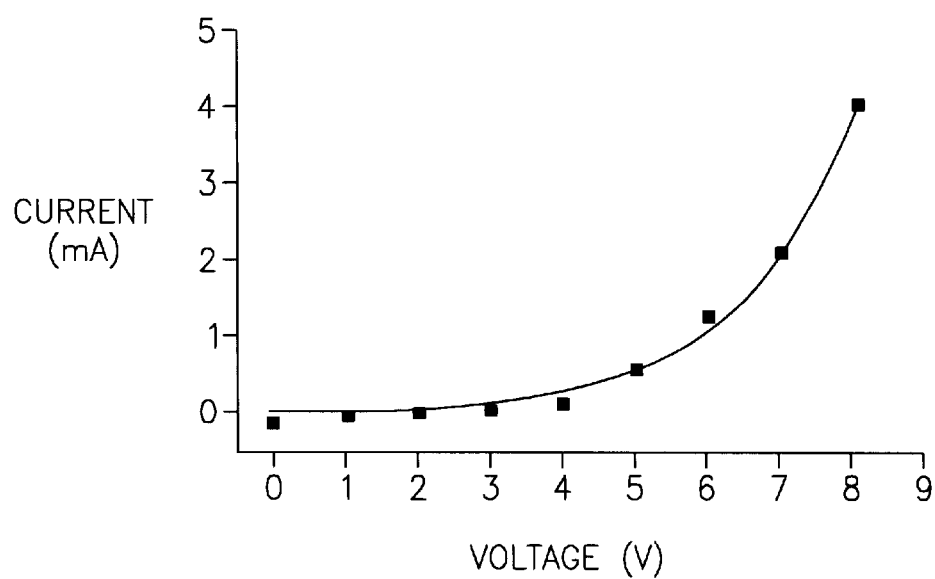

The improved in-plane packing, via p-stacking, was employed to build an organic light-emitting diode (OLED) having a thickness of a few nanometers. Initial studies on NTCDI-DAH and NTCDI-MDA superlattices electroluminescence (EL) indicated promising properties. FIGS. 11A and 11B demonstrate EL-voltage and I-V curves of resulting LEDs, with threshold voltage about 0.5 Volt. The voltage-current curve of organic CVD-MLD thin films exhibit an archetypical semiconductor character. However, this device gives an extremely low threshold voltage for emission as well as a very low thickness of organic thin film exhibiting EL phenomena.

Figure 15:
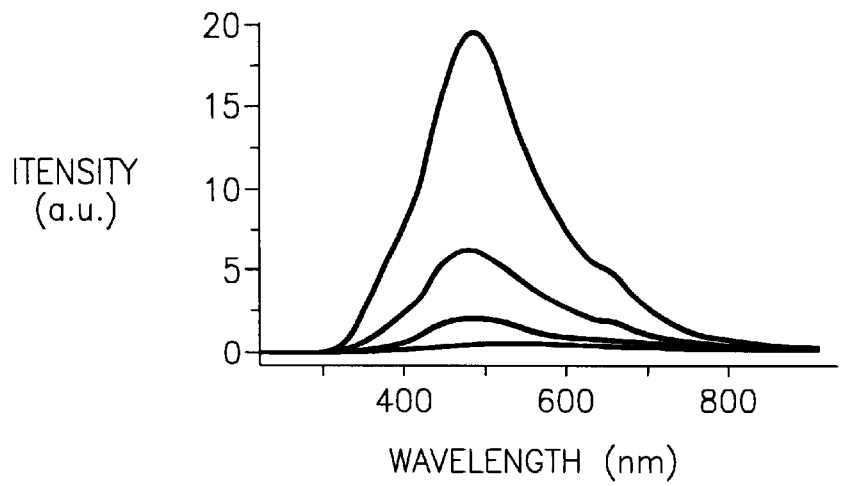
FIG. 15 is a plot of electroluminescence (EL) for a 2-layer NTCDI-MDA film at 5, 6, 7, and 8 volts.

EL spectra of 2-bilayers NTCDI-MDA film at different voltage are shown in FIG. 15, for 5, 6,7, and 8 volts. The unusual EL at U=0 V was discovered in the NTCDI-DAH and NTCDI-MDA thin films, shown in FIG. 16.

Figure 14:
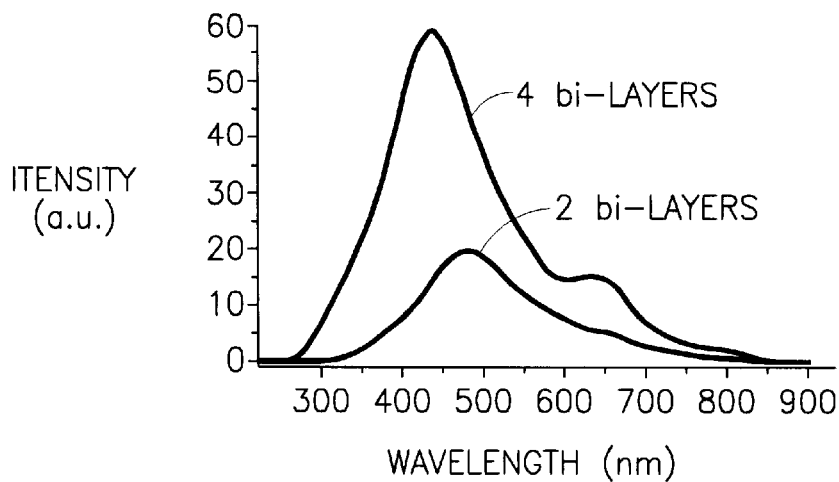
FIG. 14 is a plot of electroluminescence (EL) for 2 and 4 layers of a naphthalene-based LED constructed in accordance with the invention.
Figure 16:
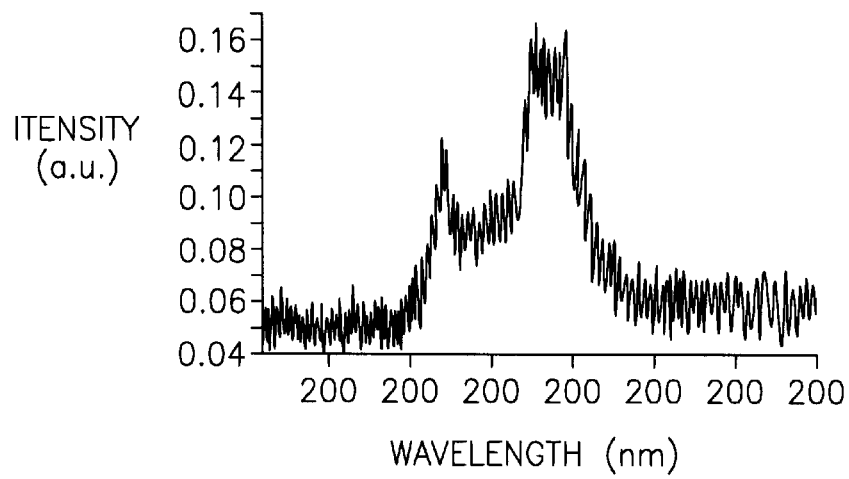
FIG. 16 is a plot of electroluminescence (EL) for a naphthalene-based superlattice at $V_{inp}=0V$.

It is noted that the EL bands in FIG. 16 are narrow and sharp, illustrating the potential applications of such a films as laser cuvettes. Another quantum confinement effect can be observe in the electroluminescence (EL)-thickness dependence in the FIG. 14 which shows EL for 2 and 4 bi-layers of CV-MLE naphthalene-based LED. EL maxima around 480 nm for 2 bi-layers of NTCDI-MDA is shifted almost to 50 nm at 4 bi-layers. This thickness dependent EL shift is observed for the first time in the organic superlattices and opens possibilities to tunable control of LEDs obtained on base of MLE-derived methods.

J. Applications: Non-Linear Optical Devices

Materials with large third-order optical nonlinearities are potentially useful for the fabrication of ultrafast (sub-picosecond) optical switches. In particular, for telecommunication applications, materials with high susceptibility, $X(chi)^{(3)} \geq 10^{-7}$ esu in the near IR region (lambda–1 $\mu$m) are desired. However, very few materials have sufficiently high $X^{(3)}$. The molecular origins of high $X^{(3)}$ materials are poorly understood, although increasing the p-conjugation length and lowering the HOMO-LUMO energy-gap both appear to be important (Nalwa, 1993).

Optimization of these parameters resulted in a porphyrin-diacetylene conjugated polymer (Anderson, et al., 1994) with low energy, high oscillator strength Q-band (lambda= 860 nm) and a high $X^{(3)}$ ($8 \times 10^{-8}$ esu). With the present invention, new mechanisms for $X^{(3)}$ enhancement can be developed. The concept of electron confinement in diminished dimensions that translates to high energy excitonic and surface states (demonstrated in inorganic-MQW26 and predicted theoretically 2a for organic-MQW) (Chemla, et al., 1984) can be exploited to enhance the $X^{(3)}$ response. The proposed quantized structures, OMQW, obtained via MLD will allow tailoring 2D structures in the range of 5 to 100 Å. Larger nanostructures, composed of ladder or rigid-rod conjugated polymers, ranging from 10 to 500 nm can be obtained by the CVD-MLE technique. Thus, the method is expected to open new routes to $X^{(3)}$ enhancement in organic semiconducting nanostructures.

Figure 18:
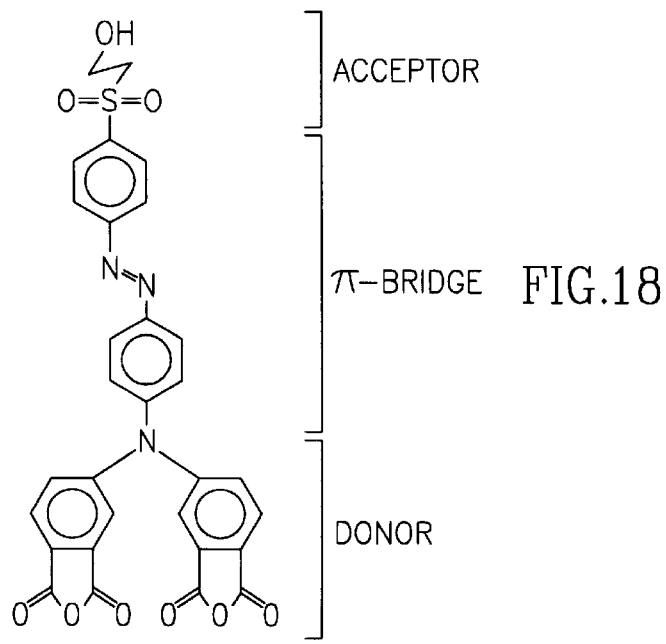
FIG. 18 shows donor, II-bridge, and acceptor layers in a non-linear optic device, in accordance with the invention.
Figure 19:
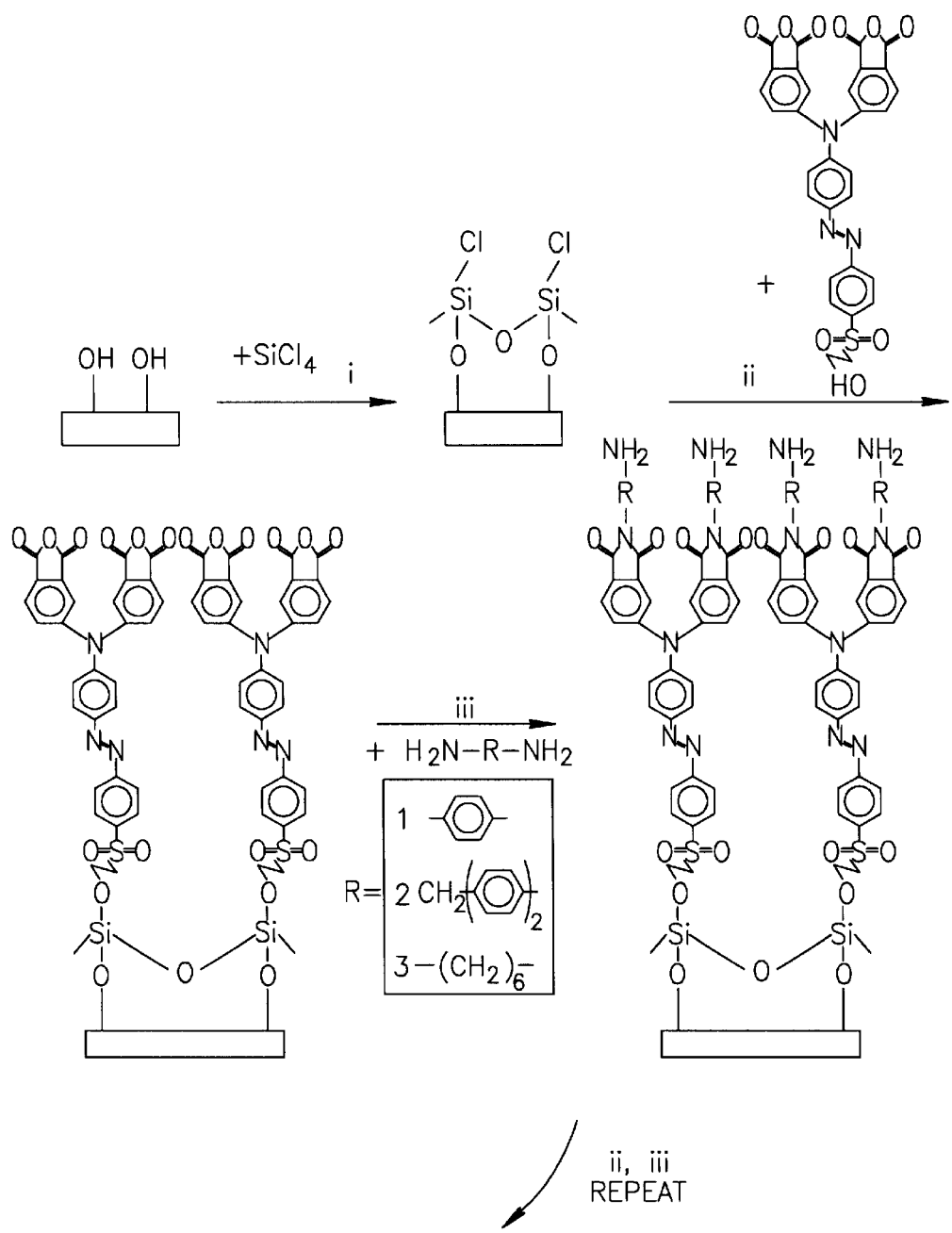
FIG. 19 illustrates a scheme for producing non-linear optic devices, in accordance with the invention.

FIG. 18 shows an example of a subunit for second harmonic generation applications. Shown here is a sample of a subunit with donor/p-bridge/and acceptor groups. The synthetic route to this structure is illustrated in FIG. 19.

K. Other Applications

Among a variety of applications for the present method and structures are the following:

An organic waveguide constructed in accordance with the invention is constructed, for example, from the vertical structure: substrate, phenyl, naphthalene, perylene. An organometallic waveguide would contain alternating layers of organometallic layers.

The NTCDI multilayered structure above, with either aliphatic of aromatic spacer moieties, showed a strong supercapacitor effect, in the form of EL after DC power was switched off.

Other applications include: organic LED arrays, switching transistors, electrooptical devices, organic thin-film elements, quantum dot well structures, FETs, metal-nitride based semiconductors, and photoreceptors.

Although the invention has been described with respect to preferred embodiments and emaples, it will be appreciated that various changes and modifications can be made without departing from the invention.

It is claimed:

1. A polymer structure comprising a substrate, formed on the substrate, a first monomolecular layer composed of monomers of a selected aromatic compound having a polycyclic form and a defined z axis oriented substantially normal to the plane of the monolayer, with the monomers forming the monolayer being covalently attached at one axial end to the substrate, and a second monomolecular layer composed of monomers of a selected aromatic compound having a polycyclic form and a defined z axis oriented substantially normal to the plane of the monolayer, with the monomers forming the monolayer being covalently attached at one axial end to an axial end of molecules forming the first monolayer.

2. The polymer structure of claim 1, where the monomers in the first monolayer are covalently attached to molecules in the second monolayer through bifunctional reagent molecules forming a monomolecular coupling layer between the two layers formed of aromatic compounds having a polycyclic form.

3. The polymer structure of claim 2, wherein the selected monomers are polycyclic tetracarboxylic-dianhydride compounds.

4. The polymer structure of claim 3, which includes a first number of layers of a first selected polycyclic compound and a second number of layers of a second selected polycyclic compound.

5. The polymer structure of claim 4, wherein the first and second compounds are perylene and naphthalene tetracarboxylic-dianhydride compounds, respectively.

6. The polymer structure of claim 2, wherein the selected polycyclic aromatic compound is covalently attached through a nitrogen based bridge, and the bifunctional reagent compound is a bismaleimide compound.

7. The polymer structure of claim 6, wherein the selected compound is a diamino carbozole.

\* \* \* \* \*